United States Patent [19]

Fulkerson

[11] 4,135,103

[45] Jan. 16, 1979

[54] LOGIC TRANSITION CIRCUITS

[75] Inventor: David E. Fulkerson, Minnetonka, Minn.

[73] Assignee: Honeywell Inc., Minneapolis, Minn.

[21] Appl. No.: 808,851

[22] Filed: Jun. 22, 1977

[51] Int. Cl.² .................... H03K 19/08; H03K 19/20; H03K 5/02

[52] U.S. Cl. ................................. 307/207; 307/208; 307/215; 307/218; 307/DIG. 1

[58] Field of Search .............. 307/203, 207, 208, 213, 307/214, 215, 218, DIG. 1, 264

[56] References Cited

U.S. PATENT DOCUMENTS

| | | | |
|---|---|---|---|
| 3,573,488 | 4/1971 | Beelitz | 307/215 X |
| 3,648,064 | 3/1972 | Mukai et al. | 307/DIG. 1 X |
| 3,766,406 | 10/1973 | Bryant et al. | 307/DIG. 1 X |
| 3,787,737 | 1/1974 | Mukai et al. | 307/214 X |
| 3,816,765 | 6/1974 | Goyer | 307/DIG. 1 X |
| 3,959,666 | 5/1976 | Fett et al. | 307/214 X |
| 3,974,402 | 8/1976 | Fett et al. | 307/DIG. 1 X |
| 4,032,796 | 6/1977 | Fulkerson | 307/215 X |
| 4,045,690 | 8/1977 | Tam | 307/DIG. 1 X |

OTHER PUBLICATIONS

Armstrong, "TTL Interfacing with GRL111 and GRL101;" *Electronic Applications* (pub.); vol. 30., No. 4, pp. 145-154; 1970.
Heuber et al., "Current Switch High-Input Levels;" *IBM Tech. Discl. Bull.;* vol. 19, No. 2, p. 545; 7/1976.
Cabiades et al., "Monolithic Circuit;" *IBM Tech. Discl. Bull.,* vol. 13, No. 8, pp. 2127-2128; 1/1971.
Taylor et al., "Logic Signal Level Shift Circuit;" *IBM Tech. Discl. Bull.,* vol. 12, No. 2, p. 296; 7/1969.
Denis, "Voltage Level Adapter Circuit;" *IBM Tech. Discl. Bull.;* vol. 18, No. 7, pp. 2184-2185; 12/1975.
Gersbach, "Voltage Level Translation Circuit;" *IBM Tech. Discl. Bull.;* vol. 18, No. 1, pp. 71-72; 6/1975.
Gopalakrishna et al., "High Impedance Off-Chip Current Switch Receiver;" *IBM Tech. Discl. Bull.;* vol. 18, No. 9, p. 2881; 2/1976.
Brearley et al., "Voltage Conversion Circuit;" *IBM Tech. Discl. Bull.;* vol. 18, No. 4, pp. 1031-1032; 9/1975.

*Primary Examiner*—Larry N. Anagnos
*Attorney, Agent, or Firm*—Theodore F. Neils

[57] ABSTRACT

Transition circuits are provided for interfacing logic gate circuits from different kinds of logic gate families where the characteristic logic state voltage levels differ between the families as do the separations between these logic state voltage levels as they occur in these logic families.

25 Claims, 8 Drawing Figures

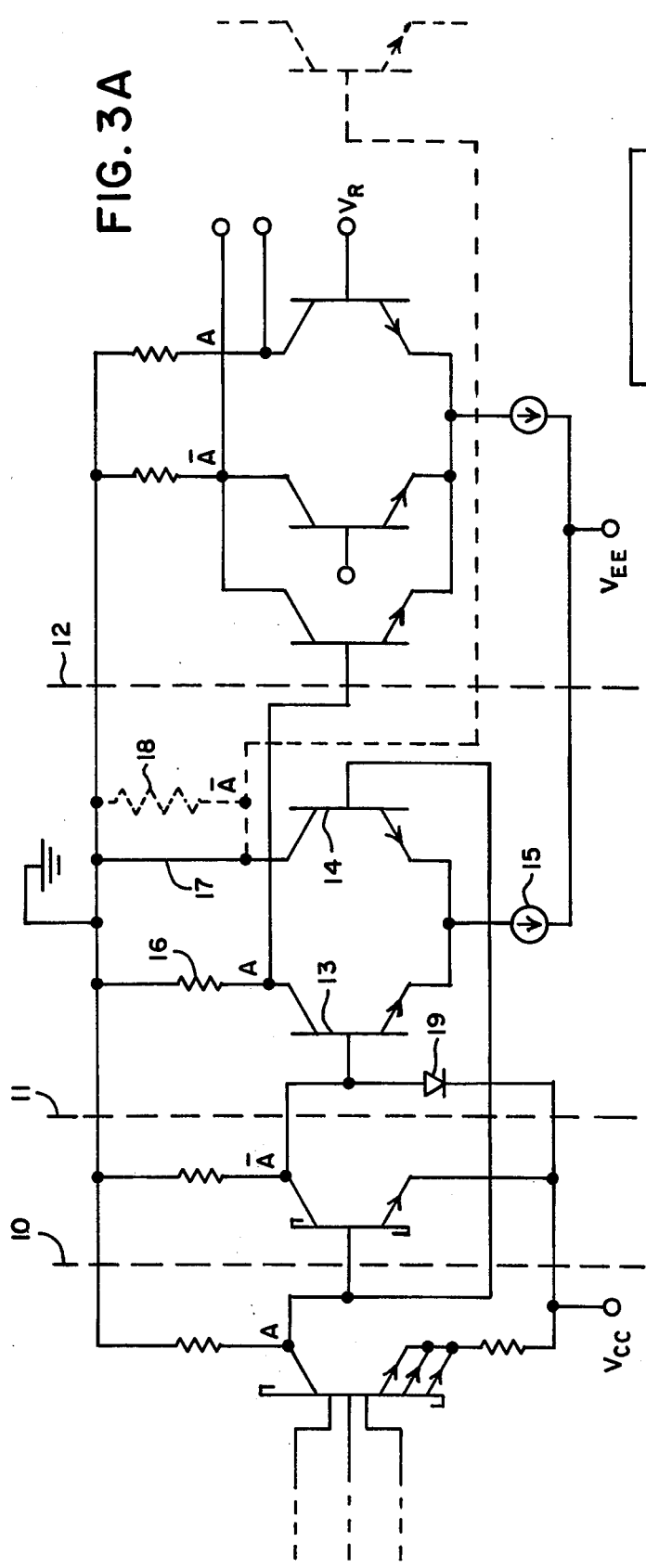
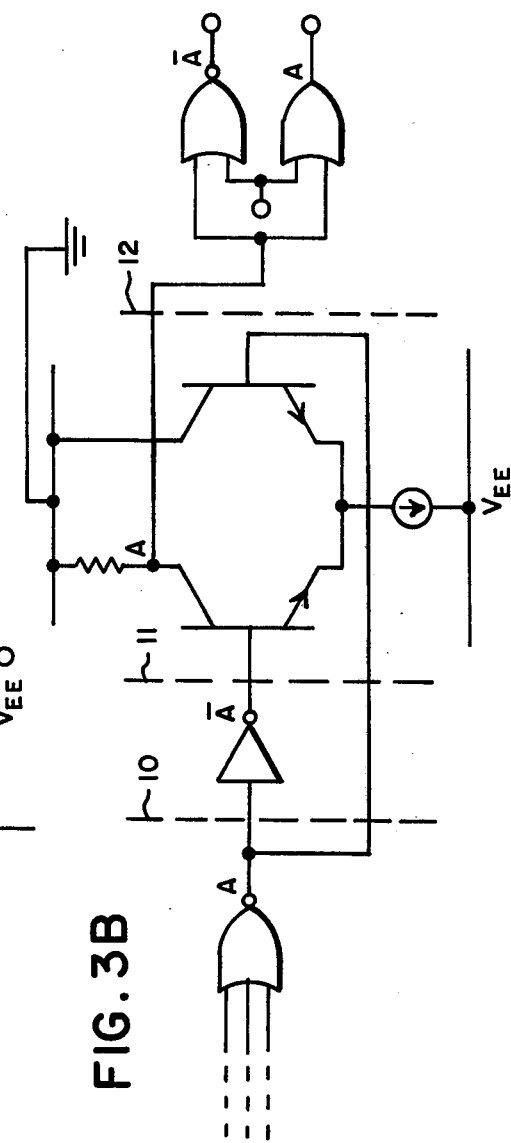
FIG. 3A
FIG. 3B

LOGIC TRANSITION CIRCUITS

BACKGROUND OF THE INVENTION

The invention herein relates to transition logic circuits for use between logic gate circuits from different logic families and, more particularly, to transition circuits for interfacing logic circuits of the general current mode logic class (circuits switching current between two outputs) and other logic circuits most often having but a single current path output.

Various kinds of logic circuit families each have their own advantages and disadvantages. Quite often, the optimum solution for a logic system design, particularly in monolithic integrated circuits, is to use logic gate circuits from more than one kind of logic family in accomplishing the system design. This poses some difficulties because the logic gate circuits in each different logic family will be operated at different logic state voltage levels and these levels, in each instance, will have a different voltage value separating them. This requires some sort of transition circuit to permit the logic signals, obtained from logic gate circuits in one kind of logic family, to be applied to logic gate circuits of another kind of logic family.

However, the design of such transition circuits must not seriously compromise the performance of the entire logic system with its gates taken from various logic families. Therefore, the transition circuit must operate with approximately the same switching rapidity as do the logic gate circuits in each of the logic family types being interfaced. Thus, when two logic family types, which are intended to have logic gate circuits taken from each interfaced, are each capable of very rapid switching, the transition circuit must also be capable of very rapid switching. Yet, at the same time, this transition circuit must provide the transition between the various voltage levels normally employed in each of the two logic family types.

Finally, when the logic family types are to be mixed in a single monolithic integrated circuit chip, the transition circuit must be compatible with the fabrication process for the forming of the other kinds of logic gate circuits present in the chip. Also, the space taken by the transition circuit being formed in the monolithic integrated circuit chip should be as small as possible to aid in achieving a high packing density of logic functions in the chip.

Some examples of prior art logic gate circuits from different current mode logic families are shown in FIGS. 1A and 1B. The circuit shown in FIG. 1A is well known as a logic gate capable of performing both the OR and the NOR logic functions. This circuit is a logic gate in what has come to be called the Current Mode Logic (CML) logic family.

Another logic gate circuit of a different current mode logic family type is shown in FIG. 1B. This logic gate can also provide both the OR and NOR logic functions. This is a logic gate in what has come to be known as the Emitter Coupled Logic (ECL) logic family.

Logic gates where the signal output is available normally from only a single current path output circuit are quite common. For instance, there are the well known Resister Transistor Logic (RTL), and Direct Coupled Transistor Logic (DCTL) logic families. These logic families are often implemented using bipolar transistors, but also, the DCTL logic family is commonly implemented using MOS transistors. More recent single output circuit logic families are shown in FIGS. 2A and 2B.

FIG. 2A shows a logic circuit from what has come to be known as the Direct Coupled Transistor-Transistor Logic ($DCT^2L$) logic family. This logic gate performs the NOR logic function. The logic gate in FIG. 2B is the typical logic gate circuit in the Diode Follower Logic (DFL) logic family. This gate also provides the NOR logic function. A resistor is sometimes added as shown by the dotted-in resistor appearing in this latter figure.

The logic gate circuits shown in FIGS. 1 and 2 each typically operate best at voltage levels which differ from that of every other. As a result, the pair of logic state voltage levels, characteristic of each logic family, differ between logic family types as do the voltage differences, i.e. voltage separations, separating these characteristic voltage levels. (These voltage separations are equivalent to the logic state voltage swings.) Thus, the mixing of the logic family types of FIGS. 1 and 2 in the same logic system design, particularly on the same monolithic integrated circuit chip, presents compatability difficulties. These difficulties must be resolved by a rapidly switching transition circuit.

SUMMARY OF THE INVENTION

A first transition circuit is provided to interface the logic gate circuit of a first logic gate family type to a second logic gate circuit of a second logic family type. This first circuit uses a differential switch responding simultaneously to both logic state voltage levels, in the logic gate circuit of the first family type, to thereby provide a logic signal or its complement to a logic gate circuit of the second logic family type. This rapidly operating transition circuit requires no additional power supply voltage levels for operation beyond those used by the logic gate circuits being interfaced.

Also provided is a second transition circuit. This second transition circuit again uses a differential switch in conjunction with a reference circuit and an input circuit to respond to the input signal, taken from a logic gate circuit of a first logic family type, to thereby provide a logic signal to a logic gate circuit of a second logic family type. In addition, the differential switch uses a clamp to keep at least a portion of the differential switch out of saturation to provide rapid switching. The second transition circuit can also provide both the NOR and the OR logic functions. Again, the second transition circuit requires no new power supply voltage levels for operation beyond those employed normally by the logic gate circuits in the first and second logic family types.

BRIEF DESCRIPTION OF THE DRAWINGS

FIGS. 3A and 4A show alternative versions of a first transition circuit of the present invention together with particular input and output logic gates presented in circuit form, FIGS. 3B and 4B again show these alternatives but with general logic gates, presented in logic symbol form, shown for the input and output logic gates.

DESCRIPTION OF THE PREFERRED EMBODIMENTS

The transition circuits disclosed below will, by way of example, show the interfacing of logic gate circuits from the CML logic family of FIG. 1A, on the one hand, with circuits from the DCT$^2$L logic family of FIG. 2A on the other. However, the transition circuits can be extended in a straightforward manner for interfacing circuits from other types of logic circuit families with one another.

Figure 1B:
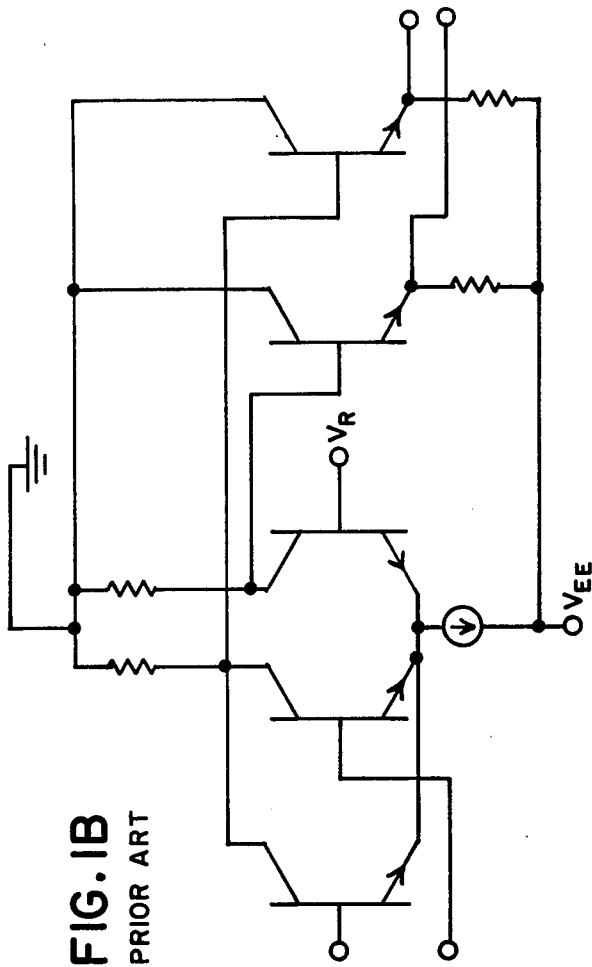
FIGS. 1 and 2 show standard logic gate circuits from various logic family types.
Figure 1A:
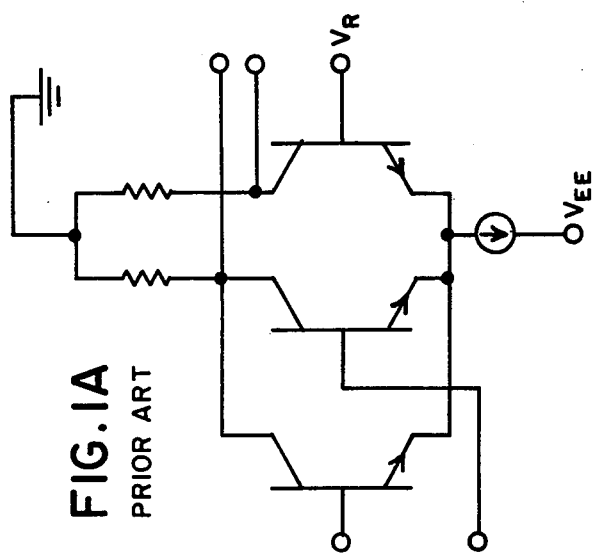

The logic gate of FIG. 1A, a CML gate performing both the NOR and the OR logic functions, typically is operated with $V_{EE} = -3.30v$. The reference voltage, $V_R$ is typically chosen to be $-0.26v$. The logic state voltage levels characteristic of the CML logic family using a gate such as the one shown in FIG. 1A, with the operating voltage levels as just specified, are 0.00v in the high logic state and $-0.50v$ in the lower logic state. This gives a voltage separation between these states, and hence the logic voltage swing for the gate, of approximately 0.50v.

Figure 2B:
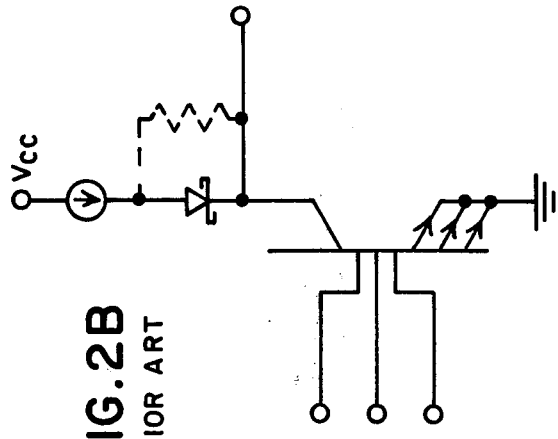
Figure 2A:
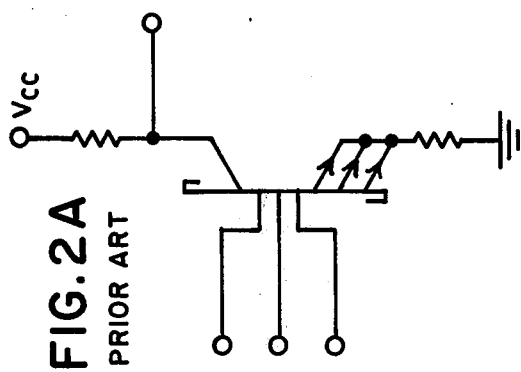

The logic gate of FIG. 2A, a logic gate in the DCT$^2$L family performing the NOR logic function, is typically operated with 2.00 volts between $V_{CC}$ and the ground symbol shown there. The high logic state voltage level is typically 0.80v while the low logic state voltage level is typically 0.40v giving a separation of approximately 0.40v. The logic levels of CML and DCT$^2$L also change differently with temperature, supply voltage changes and processing variations, thus making it even more difficult for these two circuit types to be operated satisfactorily with one another. Further, the sensing must be very rapid because the switching propagation times of the logic gates in FIGS. 1A and 2A are on the order of one nanosecond.

FIG. 3A shows a transition circuit capable of rapidly sensing the small swings in the logic state voltage levels of an input DCT$^2$L logic gate, and further capable of transmitting such logic state changes to a CML logic gate. A DCT$^2$L logic gate is shown in circuit form at the left of dashed line 10 in FIG. 3A but differing from the gate depicted in FIG. 2A in that the collector circuit thereof is operated at ground potential while the emitter circuit is operated at $V_{CC} = -2.00v$. However, this arrangement still provides approximately two volts across this DCT$^2$L logic gate just as described in connection with FIG. 2A. The high and low logic state voltage levels for this DCT$^2$L circuit are typically $-1.20v$ and 1.60v, respectively.

A CML logic gate is shown in circuit form to the right of dashed line 12 in FIG. 3A, this gate bias operated just as in FIG. 1A with $V_{EE} = -3.30v$ and $V_R = -0.26v$. FIG. 3B shows the arrangement of FIG. 3A with both the DCT$^2$L logic gate and the CML logic gate represented by standard logic symbols.

To sense the small and very rapid logic state voltage level changes that occur in the DCT$^2$L gate of FIG. 3A, occurring in response to changing inputs to that gate, a differential switch is used in the transition circuit appearing between dashed lines 11 and 12 in that figure. The use of a differential switch leads to the transition circuit being operated much the same manner as the CML logic gate to the right of dashed line 12 in FIG. 3A so that no new power source voltage values need be introduced for operating the transition circuit.

This differential switch comprises two bipolar transistors, 13 and 14, having a current source, 15, connected jointly to the emitters of transistors 13 and 14. A current source circuit arrangement such as a large resistor, or often more practically, the collector circuit of a bipolar transistor having a fixed base bias, can form an effective circuit for current source 15. For sufficient differences in voltages applied to the bases of transistor 13 and 14, substantial collector current will flow in only one or the other of the collectors of transistors 13 and 14 depending on the sense of the applied input voltage differences.

A resistor, 16, forms the collector load for transistor 13 to thereby provide a logic signal at the collector of transistor 13. That is, when the DCT$^2$L gate output is in logic state A, so will the collector of transistor 13 be in a corresponding logic state A. This logic state at the collector of transistor 13 is electrically compatible with the input requirements of the following CML gate shown in FIG. 3A. This electrical compatibility is obtained by the proper selection of values for current source 15 and resistor 16. These are typically 3mA and 160 ohms, respectively.

No logic function is available at the collector of transistor 14 as shown in FIG. 3A because a direct interconnection, 17, is shown between that collector and the ground line. However, direct interconnection 17 need not be used and instead a resistor, 18, can be substituted therefor where resistor 18 is shown dotted-in in FIG. 3A. Then the complementary logic state will appear at the collector of transistor 14, a complememnt to whatever logic state appears at the collector of transistor 13. Thereby, other CML logic gates could be driven by the collector of transistor 14, the initial portion of which is shown dotted-in to the right of dashed line 12 in FIG. 3A.

In addition to achieving electrical compatibility with the following CML gate, the use of a differential switch in the transition circuit of FIG. 3A permits the reliable sensing of the small and rapidly changing logic voltage swings occurring in the DCT$^2$L gate. To obtain logic voltage swings occurring in the opposite direction to the swings happening at the output of the DCT$^2$L gate—to thus provide the drive to permit differential switching action—a DCT$^2$L inverter is provided after the DCT$^2$L logic gate. This inverter appears between dashed lines 10 and 11 in FIG. 3A. When the DCT$^2$L logic gate to the left of dashed line 10 is in logic state A, the output of the inverter will take the complementary logic state $\overline{A}$ so that both DCT$^2$L logic states A and $\overline{A}$ are applied to the differential switch. This results in a corresponding logic state A appearing at the collector of transistor 13 which is electrically compatible with the following CML gate as indicated above.

A diode, 19, is connected from the base of transistor 13 to the DCT$^2$L voltage supply line, $V_{CC}$, to clamp the output of the inverter in the high logic state to thereby increase switching rapidity. If the increased rapidity is not needed, or the inverter drives another DCT$^2$L gate, diode 19 can be omitted.

Thus, the differential switch will have the direct output of the DCT$^2$L logic gate applied to one side thereof, while the complement of the DCT$^2$L gate output will be applied to the other side, to thereby reliably permit the very small logic state voltage level changes, or swings, occurring in the DCT$^2$L gate to be sensed in the presence of noise. This results, as set out above, in a corresponding logic state A, electrically compatible with the following CML gate, appearing at the collector of transistor 13 as indicated above.

As can be seen in FIG. 3A, only the power supply voltage values used normally in connection with the DCT²L and CML logic gate circuits shown present there are required for operating the transistion circuit also shown in that figure. That is, the inverter between dashed lines 10 and 11, serving as a coupling means from the DCT²L logic gate to the input of the transition circuit, is operated at the same voltage as the DCT²L logic gate to the left of dashed line 10. Also, the transition circuit between dashed lines 11 and 12 is operated with the power supply voltage values used in conjunction with the CML logic circuit to the right of dashed line 12.

Figure 4A:
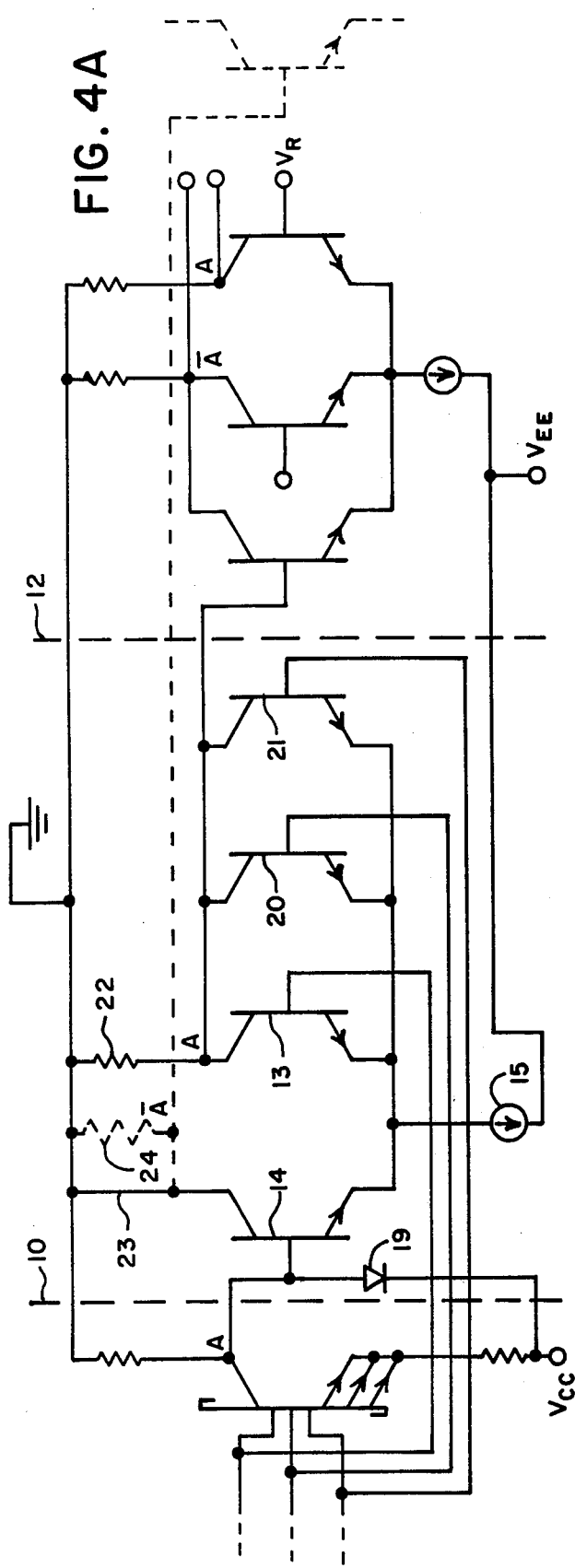
Figure 4B:
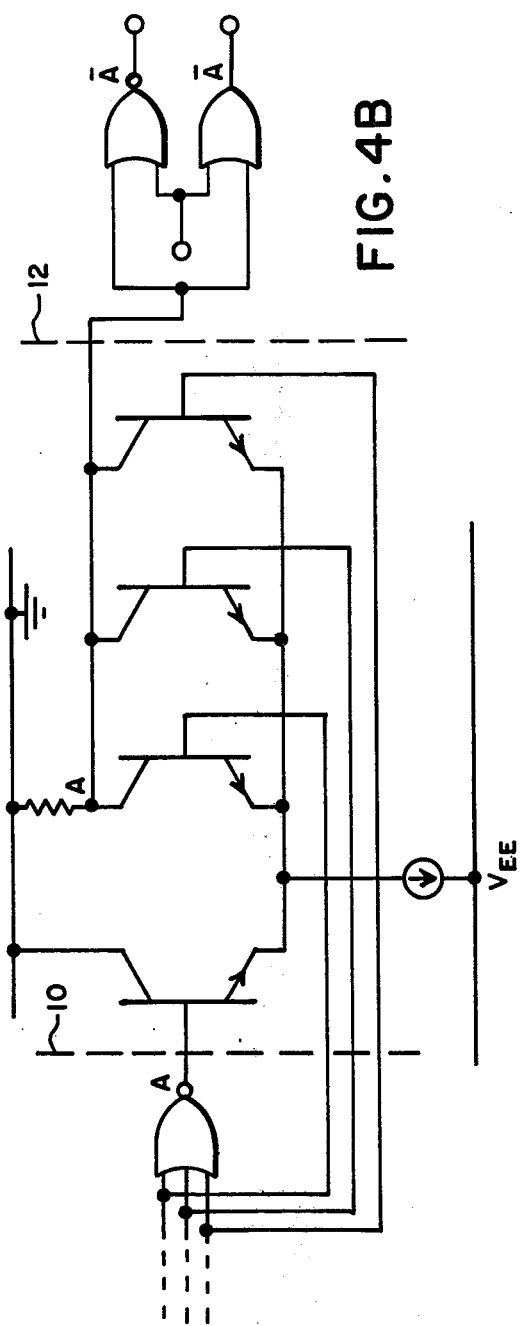

This is also true of the transition circuit shown in FIGS. 4A and 4B, an alternative to the transition circuit of FIGS. 3A and 3B. The circuit shown in FIGS. 4A and 4B eliminates the inverter of FIGS. 3A and 3B as a coupling means and substitutes therefor direct electrical interconnections from the inputs of the DCT²L logic gate to the transition circuit.

Similar to FIG. 3A, the input DCT²L logic gate shown in circuit form in FIG. 4A is found to the left of dashed line 10. Again similarly, the output CML logic gate shown in circuit form in FIG. 4A is found to the right of dashed line 12. However, the transition circuit in FIG. 4A occurs between the dashed lines 10 and 12 with no further logic gates being used in connection with the transition circuit, i.e. the inverter logic gate of FIGS. 3A and 3B is entirely omitted. As can be seen at a glance, the power supply voltage values used in FIG. 4A are again just those used in connection with DCT²L and CML logic gates present there. FIG. 4B again presents the circuits of FIG. 4A but with the DCT²L logic gate and the CML logic gate being represented in logic symbol form.

Again as in FIG. 3A, transistor 14 in FIG. 4A is directly coupled to the output of the DCT²L logic gate to the left of dashed line 10. Transistor 13, rather than being connected through an inverter to the output of DCT²L logic gate, as in FIG. 3A, is directly electrically connected to one of the inputs of the DCT²L logic gate in FIG. 4A. Further, two new transistors, 20 and 21, are operated in parallel with transistor 13 and have the control inputs thereof, i.e. bases thereof, directly electrically connected to the remaining inputs of the DCT²L logic gate. The emitters of all of these transistors are connected to current source 15 while a resistor, 22, provides a collector load for transistors 13, 20 and 21.

Since transistors 13, 20 and 21, one for each input to the DCT²L gate, together perform the NOR logic function just as the DCT²L logic gate does, the output at the collectors of these transistors represents the same corresponding logic state as appears at the output of the DCT²L logic gate just as occured at the collector of transistor 13 in FIG. 3A. Again, the logic state voltage levels at the collectors of transistors 13, 20 and 21 are compatible with the following CML gate by a proper choice of values for resistor 22 and current source 15. Typical values are 160 ohms and 3mA, respectively. Thus, the transition circuit between dashed lines 10 and 12 in FIG. 4A performs the differential switch function without need of an inverter logic gate while still retaining the capability of sensing the small voltage swings between the logic states of the DCT²L logic gate. Diode 19 again serves just as it did in FIG. 3A and can again be omitted if appropriate.

Since the output is going to be taken, as shown in the circuit of FIG. 4A, at the collectors of transistors 13, 20 and 21, load resistor 22 has been shown connecting these collectors to the ground voltage level. There being no output shown taken at the collector of transistor 14 in FIG. 4A, a direct electrical connection 23 is shown between the collector of transistor 14 and the ground voltage level. However, again, the direct connection 23 could be removed and the dotted-in resistor, 24, shown in FIG. 4A could be substituted therefor. In that event, the collector of transistor 14 could drive further CML logic gates, the initial portion of which is shown dotted-in to the right of dashed line 12 in FIG. 4A. The appropriate logic states are shown at the collector of transistor 14, on the one hand, and the collectors of transistors 13, 20 and 21, on the other, in the transition circuit of FIG. 4A for the particular logic state shown appearing at the DCT²L gate output to the left of the dashed line 10. The corresponding logic states of the CML logic gate circuit, to the right of dashed line 12 in FIG. 4A, are shown at the outputs thereof.

The transition circuit of FIG. 4A can again be rapidly switched by the current mode switching used in the differential switch therein. Yet, this transition circuit reliably senses the smaller voltage level swings of the DCT²L gate and translates them into the larger voltage level swings, about different voltage levels, necessary for operating the CML logic gates shown to the right of dashed line 12. Again, all these circuits operate with switching propagation times on the order of one nanosecond.

Figure 5A:
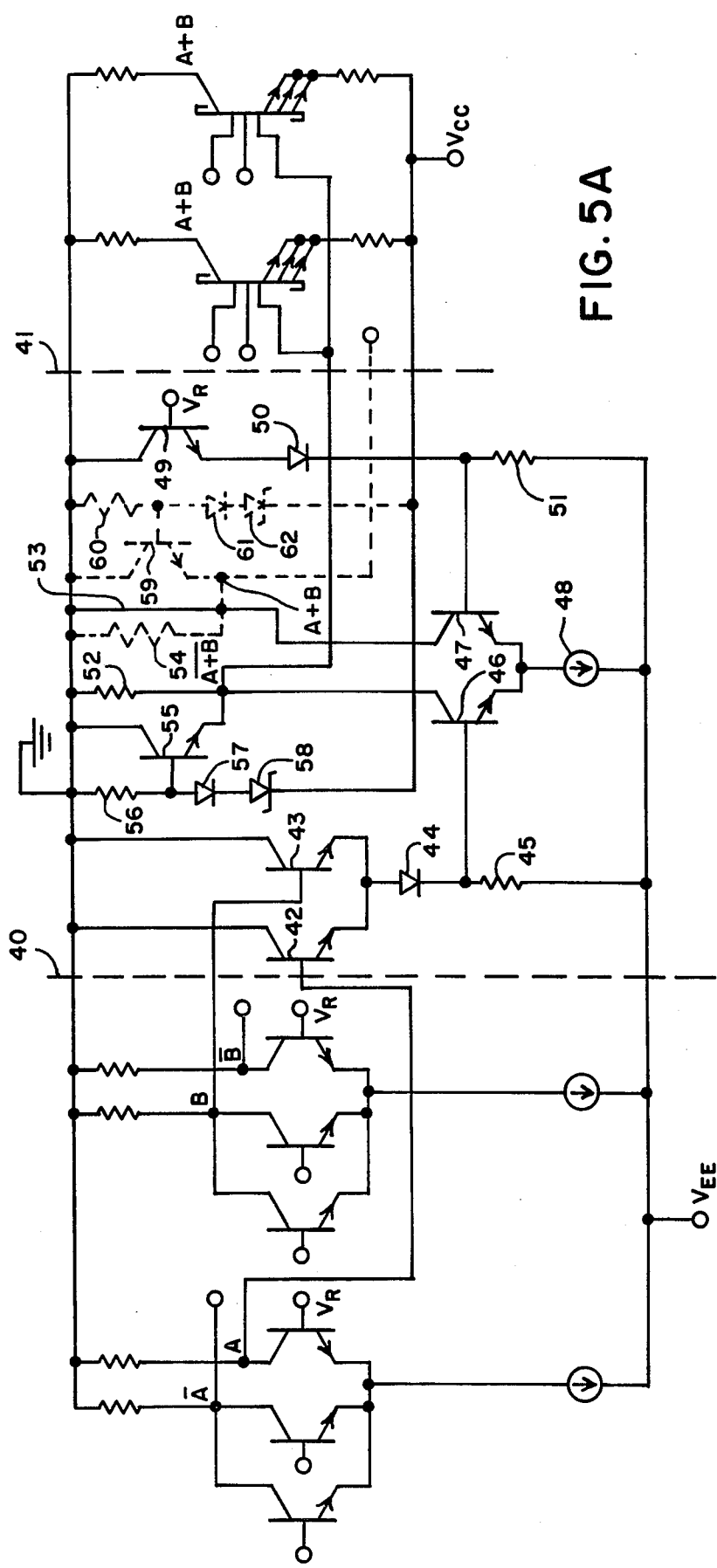
FIG. 5A shows a second transition circuit of the present invention together with particular input and output logic gates presented in circuit form, and FIG. 5B again shows this second transition circuit but with general logic gates, presented in logic symbol form, shown for the input and output logic gates.
Figure 5B:
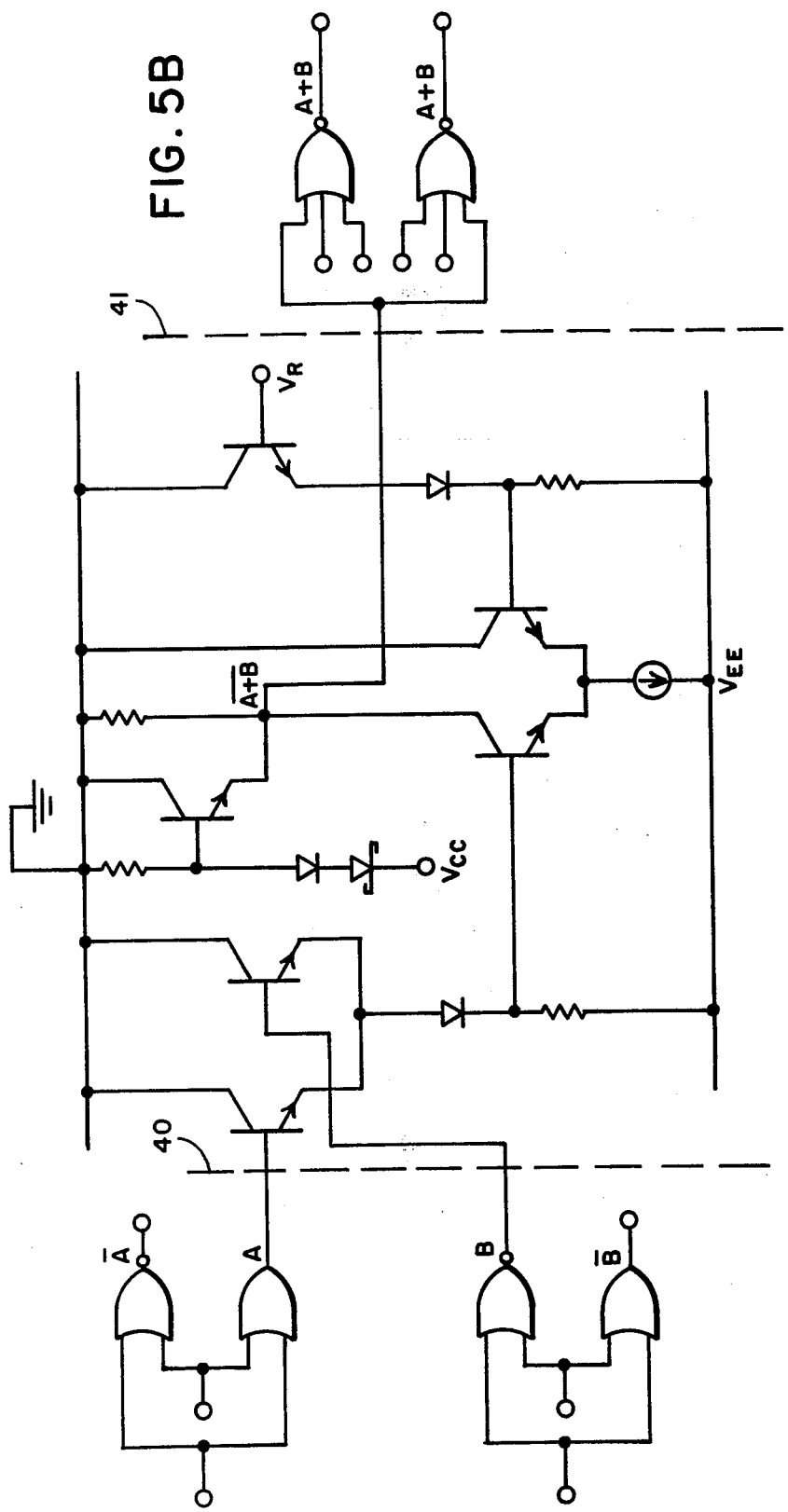

When it comes to interfacing logic gates from the different logic family types in the opposite direction, i.e. when current mode logic gates of one kind or another are the input logic gates rather than the output, the transition circuit appearing in FIGS. 5A and 5B, between dashed lines 40 and 41 is a very advantageous circuit. In FIG. 5A, two input CML logic gates are shown in circuit form to the left of dashed line 40 and two output DCT²L logic gates are shown in circuit form to the right of dashed line 41. In FIG. 5B, these logic gates are represented in logic symbol form.

Of particular note, the transition logic circuit between dashed lines 40 and 41 in FIG. 5A can perform either the NOR or the OR logic function in its own right in addition to its interfacing function. This can be seen in FIG. 5A by observing that the two CML logic gates to the left of dashed line 40, having output logic states A and B and having the corresponding outputs connected to the transition circuit inputs, leads to the function $\overline{A+B}$ appearing at the transition circuit output at the collector of transistor 46.

In more detail, the output voltage signals representing logic states A and B from the CML logic gates to the left of dashed line 40 are applied to be transition circuit input transistors, 42 and 43. The emitter output circuit of transistors 42 and 43 comprises a diode, 44, for level shifting, in series with a resistor, 45, across which the emitter circuit signal is formed. This emitter circuit signal, in response to the CML logic gates output signals, is coupled to an input transistor, 46, of a differential switch. If either CML gate is in a high logic state, at least one of transistors 42 and 43 will be turned on sufficiently to develop a voltage signal across resistor 45 sufficient to turn on transistor 46. If both CML gates are in a low logic state, no voltage signal across resistor 45 sufficient to turn on transistor 46 will occur.

A differential switch reference transistor, 47, forms the other side of the differential switch. The emitters of both transistors 46 and 47 are together joined to a current source, 48, formed by some effective current source circuit, which is also connected to the voltage supply common to the CML logic gates.

The input to the transistor 47 control terminal, or base terminal, is provided from a voltage reference source, $V_R$, of the same value used with the CML logic gates to the left of dashed line 40. This reference voltage is coupled to transistor 47 through the reference voltage transistor, 49, and through the reference transistor emitter circuit comprising a level shifting diode, 50, in series with a resistor, 51. Transistor 47 has its base voltage set by the voltage appearing across resistor 51.

The output from transition circuit of FIG. 5A is taken, as noted above, from the collector of transistor 46 across a load resistor, 52. This is the NOR logic output. Alternatively or jointly, an output can be taken from the OR output which could be provided at the collector of transistor 47. That output has not been provided as shown in FIG. 5A as a direct electrical interconnection, 53, as shown between the collector of transistor 47 and the ground voltage level. By substituting the dotted-in resistor, 54, for direct connection 53, as indicated in FIG. 5A, the OR output becomes available. Otherwise, resistor 54 merely takes space in a monolithic integrated circuit if an output across it is not needed and can be eliminated by the use instead of direct interconnection 53.

When transistor 46 is off as a result of the inputs to transistors 42 and 43 being in the low logic state, the collector of transistor 46 will be in the high logic state and the DCT²L logic gates will be driven through resistor 52 leaving the output clamping transistor, 55, off. However, when transistor 46 is in the on condition, so that the collector of transistor 46 is in a low logic state, provision must be made so that transistor 46 does not go into saturation which would slow operation of the transition circuit.

To this end, output clamping transistor 55 is provided connected to the collector of transistor 46. The base of transistor 55 is connected to a bias circuit comprising a resistor, 56, and two diodes, 57 and 58. Diode 58 is a Schottky diode used to match the operation of transistor 55 with the voltage levels required for its proper operation in conjunction with the DCT²L logic gates connected to the output of the transition circuit. That is, the bias circuit is such that the normal low logic state voltage encountered in the DCT²L logic family is what is applied to the gates to the right of dashed line 41 when the collector of transistor 46 is at a low logic state.

When transistor 46 goes into the on condition, i.e. its collector goes to the low logic state, transistor 55 of the emitter will supply all the current required by transistor 46 to prevent its collector from dropping to a voltage low enough to go into saturation. Thus, transistor 55 will hold the collector of transistor 46 approximately one Schottky diode drop above the value of $V_{CC}$ of −2.00v. If the collector of transistor 47 is to be used as a OR logic output, then a similar clamping circuit should be added thereto comprised of dotted-in transistor, 59, and a dotted-in bias circuit comprising a resistor, 60 and two diodes, 61 and 62.

Again, the transition circuit between dashed lines 40 and 41 of FIG. 5A will reliably and rapidly sense the logic voltage swing across the input CML logic gates and translate this into the smaller logic voltage swing required to operate DCT²L logic gates around different logic voltage levels. This can be done rapidly again because of the use of a differential switch. Further, the transition circuit can provide logic functions in its own right.

The embodiments of the invention in which an exclusive property or right is claimed are defined as follows:

1. A transition circuit for interfacing logic circuit gates of differing logic family types, said transition circuit having first and second inputs adapted for connection to an input logic gate circuit of a first logic family type, where said input logic gate circuit has a first input logic gate input and an input logic gate output and where said first logic family type has a first family characteristic pair of logic state voltage levels, and said transition circuit having a first output adapted for connection to an output logic gate circuit of a second logic family type, where said second logic family type has a second family characteristic pair of logic state voltage levels, said first family characteristic pair separated by a voltage value differing from that voltage value separating said second family characteristic pair, said transition circuit comprising:

a direct differential transistor having a control terminal serving as said first input which is adapted for connection to said input logic gate output in a manner such that any logic signal present at said input logic gate output will be presented to said direct differential transistor uninverted, said direct differential transistor also having first and second direct differential transistor terminals;

a direct differential transistor load means having a first and second direct differential transistor load means terminals, said first direct differential transistor load means terminal adapted for connection to a first voltage source and said second direct differential transistor load means terminal electrically connected to said first direct differential transistor terminal;

an indirect differential transistor having a control terminal serving as said second input and having first and second indirect differential transistor terminals;

an indirect differential transistor load means having first and second indirect differential transistor load means terminals, said first indirect differential transistor load means terminal adapted for connection to said first voltage source and said second indirect differential transistor load means terminal electrically connected to said first indirect differential transistor terminal;

a first effective current source means having first and second current source terminals, said first current source terminal electrically connected to both said second direct differential transistor terminal and said second indirect differential transistor terminal, and said second current source terminal adapted for connection to a second voltage source; and a transistor coupling means having first and second coupling means terminals and containing a couping transistor, said first coupling means terminal adapted for connection to said input logic gate and said second coupling means terminal electrically connected to said indirect differential transistor control terminal in such a manner that any logic signal presented to said indirect differential transistor, obtained from logic signals occurring in said input logic gate, is at a logic state voltage level of said first family characteristic pair opposite that logic state voltage level of any corresponding signal appearing at said input logic gate output.

2. The circuit of claim 1 wherein said transistor coupling means comprises an inverter logic gate containing said coupling transistor with said first coupling means terminal being an input of said inverter logic gate adapted for connection to said input logic gate output and said second coupling means terminal being an output of said inverter logic gate.

3. The circuit of claim 2 wherein a selected one of said direct differential transistor load means and said indirect differential transistor load means is a resistance means while that one remaining is a direct electrical interconnection means.

4. The circuit of claim 3 wherein said first direct differential transistor terminal is said first output.

5. The circuit of claim 3 wherein said first indirect differential transistor terminal is said first output.

6. The circuit of claim 2 wherein both said direct differential transistor load means and said indirect differential transistor load means are resistive means.

7. The circuit of claim 2 wherein those voltage values chosen for said first and second voltage sources are substantially equal to those voltage values normally employed for two voltage sources used to supply power to logic gate circuits of said second logic family type.

8. The circuit of claim 7 wherein a diode is electrically connected to said indirect differential transistor control terminal and adapted for connectin to a third voltage source having a voltage value normally employed for a voltage source used to supply power to logic gates of said first logic family type.

9. The circuit of claim 1 wherein said input logic gate circuit has a second input logic gate input, wherein said transistor coupling means contains a direct electrical connection between said first and second coupling means terminals with said first coupling means terminal adapted for connection to said first input logic gate input, and wherein said coupling transistor has a control terminal serving as a third coupling means terminal adapted for connection to said second input logic gate input, said coupling transistor having first and second coupling transistor terminals serving as fourth and fifth coupling means terminals with said first coupling transistor terminal electrically connected to said first indirect differential transistor terminal and said second coupling transistor terminal electrically connected to said second indirect differential transistor terminal.

10. The circuit of claim 9 wherein a selected one of said direct differential transistor load means and said indirect differential transistor load means is a resistance means while that one remaining is a direct electrical interconnection means.

11. The circuit of claim 10 wherein said first direct differential transistor terminal is said first output.

12. The circuit of claim 10 wherein said first indirect differential transistor terminal is said first output.

13. The circuit of claim 9 wherein both said direct differential transistor load means and said indirect differential transistor load means are resistive means.

14. The circuit of claim 9 wherein those voltage values chosen for said first and second voltage source are substantially equal to those voltage values normally employed for two voltage sources used to supply power to logic gate circuits of said second logic family type.

15. The circuit of claim 14 wherein a diode is electrically connected to said direct differential transistor control terminal and adapted for connection to a third voltage source having a voltage value normally employed for a voltage source used to supply power to logic gates of said first logic family type.

16. The circuit of claim 1 wherein said direct differential transistor and said indirect differential transistor are both bipolar transistors.

17. A transition circuit for interfacing logic gate circuits of differing logic family types, said transition circuit having a first input adapted for connection to an input logic gate circuit of a first logic family type, where said first logic family type has a first family characteristic pair of logic state voltage levels, and said transition circuit having a first output adapted for connection to an output logic gate circuit of a second logic family type, where said second logic family type has a second family characteristic pair of logic state voltage levels, said first family characteristic pair separated by a voltage value differing from that voltage value of separating said second family characteristic pair, said transition circuit comprising:

an input transistor having a control terminal serving as said first input and having first and second input transistor terminals, said first input transistor terminal adapted for connection to a first voltage source;

an input transistor load means having first and second input transistor load means terminals, said first input transistor load means terminal electrically connected to said second input transistor terminal and said second input transistor load means terminal adapted for connection to a second voltage source;

a reference transistor having a control terminal adapted for connection to a reference voltage source and having first and second reference transistor terminals, said first reference transistor terminal adapted for connection to said first voltage source;

a reference transistor load means having first and second reference transistor load means terminals, said first reference transistor load means terminal electrically connected to said second reference transistor terminal and said second reference transistor load means terminal adapted for connection to said second voltage source;

a differential reference transistor having a control terminal electrically connected to said reference transistor load means and having first and second differential reference transistor terminals;

a differential reference transistor load means having first and second indifferential reference transistor load means terminals, said first differential reference transistor load means terminal adapted for connection to said first voltage source and said second differential reference transistor load means terminal electrically connected to said first differential reference transistor terminal;

a differential input transistor having a control terminal electrically connected to said input transistor load means and having first and second differential input transistor terminals;

a differential input transistor load means having first and second differential input transistor load means terminals, said first differential input transistor load means terminal adapted for connection to said first voltage source and said second differential input transistor load means terminal electrically connected to said first differential input transistor terminal;

a first effective current source means having first and second current source terminals, said first current source terminal electrically connected to both said second differential reference transistor terminal and said second differential input transistor terminal, said second current source terminal adapted for connection to said second voltage source;

a bias circuit having first and second bias circuit terminals, said first bias circuit terminal adapted for connection to said first voltage source and said second bias circuit terminal adapted for connection to a third voltage source; and an output transistor having a control terminal electrically connected to said bias circuit and having first and second output transistor terminals, said first output transistor terminal adapted for connection to said first voltage source and said second output transistor terminal electrically connected to a selected one of said first differential input transistor terminal and said first differential reference transistor terminal.

18. The circuit of claim 17 wherein said input transistor load means comprises a series electrical connection of a first diode means and a first resistance means with said differential input transistor control terminal electrically connected to that point where said first diode means and said first reistive means are joined, and wherein said reference transistor load means comprises a series electrical connection of a second diode means and a second resistive means with said differential reference transistor control terminal electrically connected to that point where said second diode means and said second resistive means are joined.

19. The circuit of claim 18 wherein said bias circuit comprises a series electrical connection of a third resistive means, a third diode means and a fourth diode means with said output transistor control terminal electrically connected to that point where said third resistive means joins said third and fourth diode means, said fourth diode means being a Schottky diode, and said third voltage source having a voltage value chosen substantially equal to that voltage value normally employed for a voltage supply used for supplying power to logic gates circuits of said second logic family type.

20. The circuit of claim 19 wherein said differential input transistor load means is a resistive means, said differential reference transistor load means is a direct electrical connection, and said second output transistor terminal is electrically connected to said first differential input transistor terminal serving as said first output.

21. The circuit of claim 19 wherein said differential reference transistor load means is a resistive means, said differential input transistor load means is a direct electrical connection, and said second output transistor terminal is electrically connected to said first differential reference transistor terminal serving as said first output.

22. The circuit of claim 19 wherein both said differential input transistor load means and said differential reference transistor load means are resistive means.

23. The circuit of claim 19 wherein voltage values chosen for said first and second voltage sources are substnatially equal to those voltage values normally employed for two voltage sources used to supply power to logic gate circuits of said first logic family type.

24. The circuit of claim 17 where there is an additional transistor having a control terminal serving as a second input adapted for connection to an additional input logic gate circuit of said first logic family type, and additional transistor having first and second additional transistor terminals with said first additional transistor terminal adapted for connection to said first voltage source and said second additional transistor terminal electrically connected to said second input transistor terminal.

25. The circuit of claim 17 wherein said input transistor, said reference transistor, said differential input transistor, said differential reference transistor, and said output transistor are all bipolar transistors.

* * * * *